April 26, 1966 E. R. PHILLIPS 3,248,053

MONOSTABLE FLUID AMPLIFIER AND SHIFT REGISTER EMPLOYING SAME

Filed June 18, 1964

INVENTOR
EDWIN R. PHILLIPS

BY Griffin and Stokes

ATTORNEYS 3,248,053

MONOSTABLE FLUID AMPLIFIER AND SHIFT REGISTER EMPLOYING SAME

Edwin R. Phillips, Rosemont, Pa., assignor to Sperry Rand Corporation, New York, N.Y., a corporation of Delaware Filed June 18, 1964, Ser. No. 376,086
8 Claims. (Cl. 235—201)

The present invention relates to pure fluid operated devices suitable for use with data systems utilizing fluid principles. More particularly, the present invention relates to novel monostable fluid amplifiers and to novel data shift registers employing said amplifiers.

An object of this invention is to provide a monostable fluid amplifier, said amplifier having means for producing an internal positive feedback signal by reversing the direction of flow of a portion of the power stream, and means for restricting power stream flow through one of its output channels.

An object of the invention is to provide a monostable fluid amplifier having a power stream input, first and second output channels for receiving said power stream, fixed means restricting flow of said power stream out of one of said output channels any time it is directed thereto whereby said power stream seeks a stable path of flow into the other of said output channels, and a control signal input channel responsive to fluid signals for momentarily deflecting said power stream into said one output channel.

An object of this invention is to provide a fluid amplifier having a stable and an unstable state, a first control input for causing said amplifier to momentarily assume said unstable state, and a second control input for preventing said amplifier from assuming said unstable state.

A further object of this invention is to provide a bistable fluid amplifier having first and second inputs responsive to fluid signals for producing fluid output signals representing binary ones and zeros, first means for producing shift signals, second means for producing fluid data signals representing binary ones and zeros, third means responsive to said first and second means for applying fluid signals to said first input of the bistable amplifier when the second means does not produce signals representing binary zeros, and fourth means responsive to said first and second means for applying fluid signals to said second input of the bistable amplifier when the second means does not produce signals representing binary ones, said third and fourth means each comprising a monostable fluid amplifier having one input responsive to the shift signals for generating an output signal and a second input responsive to the data signals for inhibiting generation of said output signal.

A further object of the invention is to provide a multistage binary shift register having one bistable fluid amplifier and two monostable fluid amplifiers in each stage. One monostable amplifier in each stage has its unstable output connected to the set input of the bistable amplifier while the unstable output of the other monostable amplifier is connected to the reset input of the bistable amplifier. The two outputs from each bistable amplifier are connected to the inhibit inputs of the monostable amplifiers in the next stage. Each monostable amplifier has a control signal input which is connected to a source which provides a sequence of fluid shift pulses. When a monostable amplifier receives a shift pulse it switches to its unstable state and applies a signal to the bistable amplifier of the same stage provided it is not receiving an inhibit signal from the bistable amplifier of the preceding stage.

A further feature of the invention is the provision of a fluid shift register as described above and having key operated means connected to the monostable amplifiers for selectively entering binary bits of information into individual stages of the register.

Other objects of the invention and its mode of operation will become apparent upon consideration of the following description and the accompanying drawings in which.

Figure 1:
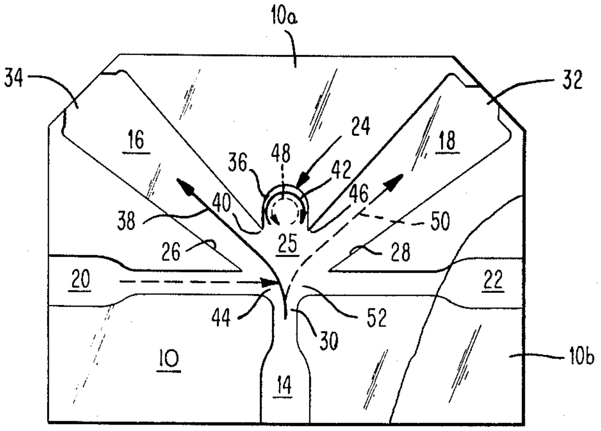
FIGURE 1 shows a plan view of a monostable fluid amplifier with a major portion of the cover plate broken away.

FIGURE 1 shows a preferred embodiment of my novel monostable fluid amplifier. In this embodiment the amplifier 10 comprises first and second flat plates 10*a* and 10*b*. Plate 10*a* has formed in one surface thereof a power stream inlet or input channel 14, first and second outlets or output channels 16 and 18, first and second control signal inlets or input channels 20 and 22, a feedback chamber 24, and an interaction chamber 25.

Plate 10*b* is flat and serves as a cover plate. It is secured to plate 10*a* in a fluid tight relationship by an adhesive, screws or other suitable means so as to prevent the escape of fluid from the system except through the output channels.

The plates 10*a* and 10*b* may be made of plastic, metallic, ceramic or other material and the channel and chamber configuration may be formed in plate 10*a* by any of several known methods including stamping, molding, etching and so forth.

A power stream source (not shown) continuously supplies fluid to power stream input channel 14. This source may be a pump or compressor and preferably includes conventional regulating means for insuring that fluid is supplied to channel 14 at a substantially constant rate.

The amplifier works on the principle of momentum exchange. That is, fluid control streams striking a high velocity power jet stream impart momentum to the jet stream thus changing its direction of flow without dispersing or breaking it up. Therefore, the walls 26 and 28 of the output channels may be offset from the edges of orifice 30 and diverge rapidly from the centerline of the orifice to reduce boundary layer effects and prevent the power stream from "locking-on" to one of the walls 26 or 28. The design techniques for accomplishing this are well known in the art. It should be noted, however, that even though the present invention functions satisfactorily without boundary layer effects, it is possible to provide for boundary layer control in addition to control by means of momentum exchange.

The amplifier is made monostable by restricting power stream flow through output channel 18. The flow may be restricted in any one of several ways but preferably is accomplished by providing a restrictive output orifice 32. On the other hand, output channel 16 terminates at an orifice 34 which is made sufficiently large to pass the power stream without causing a buildup of pressure in the output channel.

Vectors 38 and 42 illustrate the flow conditions existing in the amplifier when it is in its stable state. Assume that no control signals are being applied to input channels 20 and 22. When power stream fluid is first applied to power stream channel 14 is passes through orifice 30 and enters the interaction chamber 25 as a high velocity jet stream. If the amplifier is perfectly symmetrical the power stream flows into feedback chamber 24, hits the wall of the chamber, divides, and flows out of the chamber into output channels 16 and 18. Because of restrictive orifice 32 the pressure in output channel 18 begins to build up thus making the pressure on the right side of the power stream (as viewed in FIGURE 1) somewhat greater than the pressure on the left side of the power stream. The resulting force deflects the power stream slightly to the left of the centerline of orifice 30. As the power stream is deflected from the centerline it strikes the wall of chamber 24 in the region 36 and is deflected by the wall so that it flows in a clockwise direction around the chamber 24. The configuration of feedback chamber 24 is such that the deflected fluid leaves the chamber and strikes the power stream from the right thus deflecting it even further from the centerline. In a very short time the power stream assumes the path of flow indicated by vector 38 so that it flows through output channel 16 and orifice 34.

All of the power stream fluid does not flow into output channel 16. Dividing edge 40 directs a portion of the power stream into feedback chamber 24. This portion of the power stream flows around chamber 24 as indicated by vector 42, emerges from the chamber and strikes the power stream thus causing it to maintain its path of flow into output channel 16. This condition of flow is designated the stable state of the amplifier and is maintained as long as no control signal is applied to control signal input channel 20. If a fluid control signal is applied to channel 20 while the amplifier is in its stable state the control fluid is accelerated as it passes through restrictive orifice 44 and enters the interaction chamber as a high velocity control jet. The particles of fluid in the control jet strike the particles of fluid in the power jet this deflecting the power jet so that it flows toward output channel 18. Dividing element 46 catches a portion of the fluid flowing toward channel 18 and this fluid is directed in a feedback path around chamber 24 as illustrated by vector 48. The feedback fluid emerges from chamber 24 and strikes the power stream thus tending to deflect it into output channel 18 as indicated by vector 50.

Once the feedback flow is established the control signal applied to input channel 20 may be terminated. The feedback flow continues to direct the power stream along the path indicated by vector 50 so that it flows into output channel 18. These flow conditions represent the unstable state of the amplifier.

As soon as the power stream beings to flow into output channel 18 the static pressure in the output channel begins to build up because restrictive orifice 32 limits the amount of power stream fluid which may escape from the channel.

The pressure in channel 18 continues to build up until it exerts a force against the power stream which is greater than the force exerted against the power stream by the feedback fluid. At this time the power stream switches and again starts flowing into output channel 16.

The length of time that the power stream flows into channel 18 is determined by the size of orifice 32, the volume of output channel 18 and the compressibility of the working fluid. For a given orifice size the length of time increases as the volume of channel 18 increases. For a given volume output channel the time increases as the size of orifice 32 decreases.

Control signal input channel 22 serves as an inhibit input to the monostable amplifier. As explained above, a fluid signal applied to input channel 20 switches the amplifier from its stable to its unstable state. However, if a fluid signal is applied to input channel 22 at the same time the fluid signal is applied to input channel 20 the amplifier will not be switched. In this case control jets from orifices 44 and 52 both strike the power jet stream but since the control jets are flowing in opposite directions their effects are cancelled out. If desired, the momentum of the inhibit control jet may be made greater than the momentum of the control jet issuing from orifice 44 to insure that the inhibit signal will override the jet issuing from orifice 44.

Figure 2:
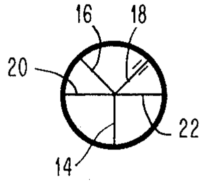
FIGURE 2 shows the logic symbol employed to represent a monostable fluid amplifier of the type shown in FIGURE 1.
Figure 3:
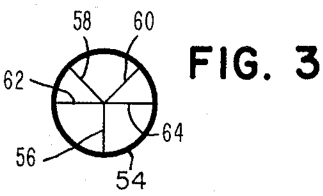
FIGURE 3 shows the logic symbol employed to represent a conventional bistable fluid amplifier; and, FIGURE 4 is a logical diagram of a fluid shift register constructed in accordance with the principles of the present invention.

FIGURE 2 shows the symbol employed to represent a monostable amplifier of the type described above. FIGURE 3 shows the symbol employed to represent a conventional bistable amplifier. Bistable amplifier 54 has a power stream input channel 56, first and second output channels 58 and 60, and first and second control signal input channels 62 and 64 for selectively switching the power stream into channels 60 and 58, respectively. The amplifier has a first stable state, designated the "zero" or reset state, represented by power stream flow from channel 56 through output channel 60, and a second stable state, designated the "ones" or set state, represented by power stream flow from channel 56 through output channel 58. As will be obvious from the subsequent description of FIGURE 4 bistable amplifier 54 may take any one of several forms now known in the art. It may, for example, be a bistable amplifier of the type disclosed in Patent No. 3,001,698.

Figure 4:
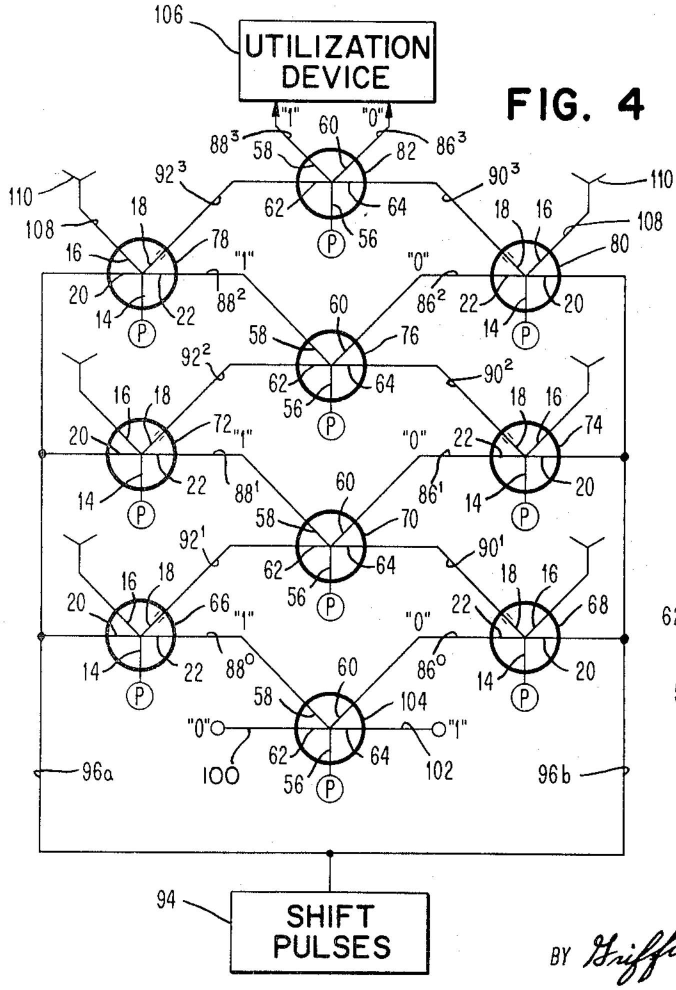

FIGURE 4 is a logic diagram of a three stage binary shift register employing two monostable fluid amplifiers and one bistable fluid amplifier per stage. Stage 1 includes monostable amplifiers 66 and 68 and bistable amplifier 70. Stage 2 includes monostable amplifiers 72 and 74 and bistable amplifier 76, and stage 3 includes monostable amplifiers 78 and 80 and bistable amplifier 82.

The state of the bistable amplifier in each stage provides an indication of whether the stage is storing a binary 0 or a binary 1. If the bistable amplifier is reset its power stream flows out through channel 60 to provide a fluid signal indicating binary 0. This signal flows through a pipe, duct or other fluid conveying means 86 and is applied to the control signal input channel 22 of one of the monostable amplifiers in the next succeeding stage. If the bistable amplifier is set then its power stream flows out through output channel 58 to provide a fluid signal indicating that the stage is storing a binary 1. This signal is conveyed by means of a pipe 88 to the control signal input channel 22 of the other monostable amplifier in the next succeeding stage.

Each monostable amplifier has its unstable output i.e. output channel 18 connected to one of the control signal input channels of the bistable amplifier in the same stage. The output channels 18 of monostable amplifiers 68, 74, and 80 are connected by means of pipes $90^1$, $90^2$, and $90^3$ to the control signal input channels 64 of bistable amplifiers 70, 76, and 82, respectively. In like manner, output channels 18 of monostable amplifiers 66, 72, and 78 are connected by means of pipes $92^1$, $92^2$, and $92^3$ to the control signal input channels 62 of bistable amplifiers 70, 76, and 82, respectively.

A source 94 provides fluid shift pulses for controlling the transfer of data from one stage to the next and these pulses are applied over pipes 96*a* and 96*b* to the control signal input channels 20 of all of the monostable amplifiers. As will be obvious from the subsequent description, fluid signal delay means (not shown) are provided in the connections between input channels 20 and pipes 96*a* and 96*b* so that each shift pulse produced by source 94 arrives at all channels 20 at substantially the same time. In addition, the power stream input channels of all of the bistable and monostable amplifiers are connected to a source P which continuously supplies power stream fluid.

When operated as a shift register with serial input, fluid signals representing binary zeros and binary ones are selectively applied over pipes 100 and 102 to the control signal inputs of a bistable amplifier 104. The zero output of amplifier 104 is connected by means of pipe $86^0$ to input channel 22 of amplifier 68 and the ones output of amplifier 104 is connected by means of pipe $88^0$ to control signal input channel 22 of amplifier 66 for the purpose of entering binary data into the shift register. In those applications where it is desirable to have serial readout of the information stored in the register, the outputs of bistable amplifier 82 are connected by means of pipes $86^3$ and $88^3$ to a utilization device 106. This utilization device may be an arithmetic unit, another shift register, or merely subsequent shift register stages similar to those shown.

The operation of the shift register may be best understood by considering a specific numerical example. Assume that the sequence of binary bits 110 is to be entered into the shift register. Assume further that all of the bistable amplifiers 70, 76, 82, and 104 are in the zero or reset state. The fluid signal representing the first binary one is applied over pipe 102 to input 64 of amplifier 104 thus switching this amplifier to the ones state. The power stream of amplifier 104 flows through output 58 and pipe $88^0$ to the inhibit input channel 22 of monostable amplifier 66. Next, source 94 produces a fluid shift signal. The shift signal flows through pipe **96*a* to input channel 20 of amplifier 66 but does not switch the amplifier because of the fluid signal being applied to inhibit input channel 22. The fluid shift signal is also applied over pipe 96*b* to control input signal input 20 of amplifier 68. The inhibit input channel 22 of this ampilfier is not receiving a fluid signal from amplifier 104 so the shift signal applied to input 20 deflects the power stream of amplifier 68 into output channel 18. The first shift signal is terminated soon after the power stream of amplifier 68 is deflected into output channel 18 but the internal feedback wtihin the amplifier continues to deflect the power stream into this output channel. Because of the volume of the output channel a signal is not immediately available at the output of the amplifier. After a short interval of time during which the pressure in channel 18 is increasing a fluid signal appears at the output of the channel which is of sufficient magnitude to switch the bistable amplifier 70. This signal passes over pipe $90^1$ to control signal input 64 of amplifier 70 thus setting the bistable amplifier to its ones state. When amplifier 70 is set to its ones state its power stream flows through output channel 58 and pipe $88^1$ to apply an inhibit signal to the monostable amplifier 72**.

It should be noted that when bistable amplifier 70 is switched to the ones state it stops applying an inhibit signal to monostable amplifier 74. If the first shift pulse were still being generated at this time then amplifier 74 would be erroneously switched. Therefore, the duration of the shift pulses should be less than the time that elapses between the switching of a monostable amplifier in one stage and the change (if any) in the inhibit signals applied to the succeeding stage. In order to insure that this condition exists additional fluid capacitances or delays may be provided in the pipes connected to output channels 18.

The pressure in output channel 18 of amplifier 68 continues to build up until it becomes of sufficient magnitude to switch the power stream of the amplifier back to output channel 16. This completes the operations required to enter the first binary one into the first stage of the shift register.

When the second binary one is to be entered into the shift register a fluid pulse appears on pipe 102 and is applied to input 64 of bistable amplifier 104 thus tending to set the amplifier. However, amplifier 104 was set to the ones state by the previous data bit and has not been reset so the second pulse on pipe 102 has no appreciable effect on the circuit. Therefore, when source 94 produces the second shift pulse amplifiers 104 and 70 are applying fluid signals to the inhibit input channels of monostable amplifiers 66 and 72.

The second fluid shift pulse passes over pipe **96*a* to the input 20 of monostable amplifiers 66 and 72 but has no effect because these amplifiers are receiving signals at their inhibit inputs. The second shift pulse also passes over pipe 96*b* to control signal inputs 20 of monostable amplifiers 68 and 74. The shift pulse switches the power stream of amplifier 68 to its unstable state and the amplifier produces an output signal which passes over pipe $90^1$ to input 64 of bistable amplifier 70. Since amplifier 70** is already in the binary ones state this signal has no appreciable effect.

The shift pulse applied to input 20 of monostable amplifier 74 switches the power stream of this amplifier to output channel 18. The amplifier produces an output signal that passes over pipe $90^2$ to control signal input 64 of amplifier 76. This switches the amplifier 76 to the ones state and the power stream flows through pipe $88^2$ to the inhibit input channel of monostable amplifier 78. The power streams of monostable amplifier 68 and 74 now switch so that they again flow into output channels 16.

In the assumed example the third binary bit of information is a zero. A fluid signal is applied over pipe 100 to control signal input 62 of amplifier 104. This switches the power stream of the amplifier so that it flows through output channel 60 and pipe $86^0$ and is applied to inhibit input 22 of monostable amplifier 68. Since the power stream of amplifier 104 no longer flows into output channel 58 no inhibit signal is applied to monostable amplifier 66.

The third shift pulse produced by source 94 is applied over pipe **96*a* to control signal inputs 20 of amplifier 66, 72, and 78. Amplifiers 72 and 78 are receiving signals at their inhibit inputs so the shift pulse has no effect on these amplifiers. However, since amplifier 66 is not receiving an inhibit signal the third shift pulse switches the power stream of this amplifier and the amplifier produces an output signal that is applied over pipe $92^1$ to control signal input 62 of amplifier 70. This signal switches amplifier 70 to the zero state so that its power stream flows through output channel 60 and pipe $86^1$ to the inhibit input of monostable amplifier 74**.

The third shift pulse produced by source 94 is applied over pipe **96*b* to the inputs 20 of amplifiers 68, 74, and 80 at the same time the pulse was applied to amplifier 66, 72, and 78 over pipe 96*a*. Therefore, before amplifier 70 applies an inhibit signal to amplifier 74 the third shift pulse switches the power stream of amplifier 74 into output channel 18 so a signal is applied to input 64 of amplifier 76. Since amplifier 76** is already in the ones state this signal has no appreciable effect.

The third shift pulse applied to amplifier 68 has no effect since this amplifier is receiving an inhibit input from amplifier 104.

The third shift pulse switches monostable amplifier 80 so that its power stream flows into output channel 18. The amplifier produces an output signal that flows through pipe $90^3$ to control signal input 64 of amplifier 82. This switches amplifier 82 to the ones state so that its power stream flows through output channel 58 and pipe $88^3$ to the utilization device. Monostable amplifiers 66, 74, and 80 then switch back to their stable state to complete the operation. At this time amplifiers 82 and 76 are in the ones state to represent binary ones and amplifier 70 is in the zero state to represent a binary zero.

The shift register shown in FIGURE 4 also includes means for entering a bit of data into an individual register stage without having to shift through preceding stages of the register. Output channel 16 of each of the monostable amplifiers is connected to pipe 108 which terminates at an orifice in a key 110. This key may be of the type disclosed in Wadey Patent No. 3,034,628.

Assume that bistable flip-flop 82 is in the set condition representing a binary 1 and it is desired to reset the amplifier. An operator may place a finger over the orifice in key 110 thus blocking output channel 16 of monostable amplifier 78. The pressure builds up in channel 16 to the point where the power stream switches into output channel 18. Amplifier 78 produces a fluid signal which flows through pipe $92^3$ to control signal input 62 thereby resetting amplifier 82. As soon as the operator removes the finger from the key the high pressure in output channel 18 resulting from the restricted output orifice deflects the power stream back into output channel 16 so that it again exhausts through the orifice in key 110.

If bistable amplifier 82 is in the zero state it may be set to the ones state by blocking the orifice in key 110 connected to the output channel 16 of monostable amplifier 80. This operation is believed obvious from the preceding description.

While the keys 110 provide one means for resetting individual stages of this shift register it is desirable in many applications to have means for simultaneously resetting all of the bistable amplifiers. This may be accomplished in known manner by providing each of the bistable amplifiers with a second control signal input channel functioning in the same manner as input channel 62 with the additional control channel being connected to a source which supplies a fluid signal each time the bistable amplifiers are to be reset.

While specific embodiments have been shown and described herein for the purpose of illustrating the basic concepts of the invention, various modifications and substitutions falling within the spirit and scope of the invention will be obvious. For example, it is well known that serial shift registers of the type shown herein may be readily modified to provide for simultaneous input of information to all stages of the register and/or for simultaneous readout of information from each stage of the register. It is intended therefore to be limited only by the scope of the appended claims.

The embodiments of the invention in which an exclusive property or privilege is claimed are defined as follows:

1. A multistage shift register comprising:
a bistable fluid amplifier for each of said stages,
each of said bistable amplifiers having a set input and a reset input and a set output and a reset output,
first and second monostable fluid amplifiers for each of said stages,
each of said monostable amplifiers having a power stream input, an unstable output, a first control input responsive to fluid signals for switching said monostable amplifier to said unstable output, and a second control input for inhibiting said unstable output,
means in each of said stages for connecting the unstable outputs of said monostable amplifiers to the set and reset inputs of said bistable amplifier,
means connecting the set and reset outputs of the bistable amplifier in each of said stages to the second control inputs of the monostable amplifiers in the next stage,
and means for simultaneously applying fluid signals to the first control inputs of each of said monostable amplifiers.

2. A multistage shift register as claimed in claim 1 and further comprising: means for applying fluid signals representing binary zeros and binary ones to the second control inputs of the first and second monostable amplifier, respectively, in the first state of said register.

3. The combination comprising:
a bistable fluid amplifier having first and second inputs responsive to fluid signals for producing fluid output signals representing binary ones and zeros,
first means for producing shift signals,
second means for producing fluid data signals representing binary ones and zeros,
third means responsive to said first and second means for applying fluid signals to said first input of said bistable amplifier when said second means does not produce signals representing binary zeros,
fourth means responsive to said first and second means for applying fluid signals to said second input of the bistable amplifier when the second means does not product signals representing binary ones,
said third and fourth means each comprising a monostable fluid amplifier having a power stream and one input responsive to said shift signals for generating an output signal and a second input responsive to said data signals for inhibiting the generation of said output signal.

4. A binary shift register comprising:
first and second groups of monostable fluid amplifiers, each of said monostable amplifiers having a first input responsive to fluid signals for causing a power stream to assume an unstable state of flow and produce a first output signal and a second input responsive to fluid signals for preventing the power stream from assuming said unstable state of flow,
means for applying a sequence of fluid shift signals to the first inputs of said monostable amplifiers,
a series of bistable state amplifiers each having first and second inputs for selectively switching a power stream to first and second outputs,
means connecting the first output of each specific bistable amplifier and the second input of one amplifier of said first group so that the output from the first output of each specific bistable amplifier goes to said second input of only one amplifier of said first group and each second input of each amplifier of said first group receives an output from only one bistable amplifier,
means connecting the second output of each specific bistable amplifier and the second input of one amplifier of said second group so that the output from the second output of each specific bistable amplifier goes to said second input of only one amplifier of said second group and each second input of each amplifier of said second group receives an output from only one bistable amplifier,
means for applying said first output signals from the monostable amplifiers in said first group to the first inputs of said bistable amplifiers so that the first input of each bistable amplifier receives an output signal from only one monostable amplifier of said first group,
means for applying said first output signals from the monostable amplifiers in said second group to the second inputs of said bistable amplifiers so that the second input of each bistable amplifier receives an output signal from only one monostable amplifier of said second group,
and means for supplying power stream fluid to all said amplifiers.

5. The combination as claimed in claim 4 and further comprising means for sensing the state of at least one of said bistable amplifiers.

6. The combination as claimed in claim 4 and further comprising means for selectively applying fluid signals representing binary zeros and ones to a predetermined amplifier in said first group and a predetermined amplifier in said second group, said predetermined amplifiers being the ones having their output signals applied to the first bistable amplifier in said series.

7. A binary shift register as claimed in claim 4 wherein each of said monostable amplifiers has an output channel to which its power stream normally flows, and individually operable key means for selectively blocking said output channels to switch the corresponding monostable amplifier to its unstable state.

8. A binary shift register as claimed in claim 4 wherein each of said monostable amplifiers includes means for restricting power stream flow as said first output signals are produced to thereby create a back pressure which switches the power stream to its stable state of flow.

(References on following page)

References Cited by the Examiner

UNITED STATES PATENTS

| | | | |
|---|---|---|---|
| 3,001,539 | 9/1961 | Hurvitz | 235—201 |
| 3,159,169 | 12/1964 | Reader | 235—201 X |

OTHER REFERENCES

ASME Symposium on Fluid Control Devices, "Fluid Jet Control Devices" pp. 83–90 relied on. November 28, 1962.

Norwood, "Generating Timed Pneumatic Pulses" IBM Technical Disclosure Bulletin, vol. 5, No. 9, February 1963. Pp. 13 and 14.

Mitchell et al., "Fluid Logic Devices and Circuits," Transactions of the Society of Instrument Technology. Pp. 3–7 relied on. Feb. 26, 1963.

Shinn, "No Moving Parts Needed" SHE Journal, August 1963. Page 41 relied on.

LEO SMILOW, *Primary Examiner.*

W. F. BAUER, *Assistant Examiner.*